United States Patent
Wan et al.

(10) Patent No.: US 11,271,363 B1
(45) Date of Patent: Mar. 8, 2022

(54) MULTI-CHANNEL PARALLEL TRANSMISSION OPTICAL DEVICE AND ITS PACKAGE STRUCTURE

(71) Applicant: Linktel Technologies Co., Ltd., Wuhan (CN)

(72) Inventors: Ren Wan, Wuhan (CN); Linke Li, Wuhan (CN); Tianshu Wu, Wuhan (CN); Xianwen Yang, Wuhan (CN); Jian Zhang, Wuhan (CN)

(73) Assignee: LINKTEL TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/447,418

(22) Filed: Sep. 10, 2021

(30) Foreign Application Priority Data

May 7, 2021 (CN) .......................... 202110492942.6

(51) Int. Cl.
| | | |
|---|---|---|
| *H01S 5/02255* | (2021.01) | |
| *H01S 5/02212* | (2021.01) | |
| *H04B 10/50* | (2013.01) | |
| *H01S 5/02253* | (2021.01) | |
| *H01S 5/024* | (2006.01) | |
| *H01S 5/40* | (2006.01) | |

(52) U.S. Cl.
CPC ...... *H01S 5/02255* (2021.01); *H01S 5/02212* (2013.01); *H01S 5/02253* (2021.01); *H01S 5/02469* (2013.01); *H01S 5/4025* (2013.01); *H04B 10/503* (2013.01)

(58) Field of Classification Search
CPC ............. H01S 5/02255; H01S 5/02212; H01S 5/02253; H01S 5/02469; H01S 5/4025; H04B 10/503
See application file for complete search history.

(56) References Cited

U.S. PATENT DOCUMENTS

| | | | |
|---|---|---|---|
| 2004/0234213 A1 | 11/2004 | Narayan et al. | |
| 2021/0083451 A1* | 3/2021 | Hashimoto | ......... H01S 5/02216 |

FOREIGN PATENT DOCUMENTS

| | | |
|---|---|---|
| CN | 101212124 A | 7/2008 |
| CN | 101859025 A | 10/2010 |
| CN | 109188620 A | 1/2019 |
| CN | 109683257 A | 4/2019 |
| CN | 112234429 A | 1/2021 |
| JP | 2012238647 A | 12/2012 |

* cited by examiner

*Primary Examiner* — Yuanda Zhang
(74) *Attorney, Agent, or Firm* — Bayramoglu Law Offices LLC

(57) ABSTRACT

A package structure for the multi-channel parallel transmission optical device includes a package base, a package cap which is used to form a package shell with the package base, and a plurality of laser generating units that are all mounted on the package base and arranged annularly relative to the axis of the package base. Each laser generating unit is equipped with an optical mirror group to convert the laser emitted by the laser generating unit into the laser beam parallel to the axis of the package base. A converging lens is also configured inside or outside the package shell, or the package cap uses the converging lens as an optical window, and to converge each laser beam into output beam. The optical path design can significantly reduce the device package volume, which correspondingly increases the channel density.

14 Claims, 4 Drawing Sheets

MULTI-CHANNEL PARALLEL TRANSMISSION OPTICAL DEVICE AND ITS PACKAGE STRUCTURE

CROSS REFERENCE TO THE RELATED APPLICATIONS

This application is based upon and claims priority to Chinese Patent Application No. 202110492942.6, filed on May 7, 2021, the entire contents of which are incorporated herein by reference.

TECHNICAL FIELD

The present invention relates to the optical communication technology field, specifically, to a package structure for the multi-channel parallel transmission optical device and a multi-channel parallel transmission optical device including the package structure for the multi-channel parallel transmission optical device.

BACKGROUND

Multi-channel parallel transmission optical devices are usually realized by free space BOX packaging technology. The main principle is to use optical elements such as filters to combine the lasers with loaded signals emitted by laser chips with different channels and specific wavelengths, in this way, a single optical fiber can transmit signals of different wavelengths, and expand the channel capacity. For general multi-channel parallel transmission optical devices, the short-distance system transmission adopts coarse wavelength division multiplexing (CWDM) technology with a wavelength interval of 20 nm; the long-distance system transmission adopts LAN wavelength division multiplexing (Lan WDM) technology with a wavelength interval of 4.5 nm.

The BOX free space packaging form is based on the optical path of the free space, and the channels are arranged in parallel, this method occupies a large amount of transverse space of the optical module; at the same time, this side-by-side structure cannot make use of the longitudinal space of the optical module, and wastes a lot of space in the longitudinal direction of the optical module; due to the waste of space, it is difficult to achieve more channels in parallel transmission. In addition, using the BOX packaging solution, taking the most common 4-channel as an example, the optical path gap between the first channel and the fourth channel is large, generally more than 2 mm, because the laser is not completely collimated after passing through the collimating lens, it will still diverge slightly, so it is difficult to ensure the optical power balance; and the manufacturing process of the BOX shell is complicated, and the mass production cost is high.

SUMMARY OF THE INVENTION

The present invention relates to a package structure for the multi-channel parallel transmission optical device and a multi-channel parallel transmission optical device including the package structure, at least part of the shortcomings of the existing technology can be solved.

The present invention relates to a package structure for the multi-channel parallel transmission optical device, comprising: a package base, a plurality of laser generating units, and a package cap; the laser generating units are all mounted on the package base and arranged annularly relative to the axis of the package base;

each laser generating unit is equipped with an optical mirror group to convert the laser emitted by the laser generating unit into the laser beam parallel to the axis of the package base;

the package cap and the package base are assembled to form a package shell, and the package shell encapsulates the optical mirror groups, wherein, a converging lens is also configured inside or outside the package shell, or the package cap uses the converging lens as an optical window, and to converge each laser beam into output beam.

As one of the embodiments, the optical mirror group comprises.

pre-processing unit for converting the laser emitted by the laser generating unit into the collimated beam that parallel to the axis of the package base;

offset prism for shifting the collimated beam to be close to or coincides with the axis of the package base, and the offset prism is connected to the downstream of the pre-processing unit.

As one of the embodiments, each of the offset prisms is arranged in sequence along the axis of the package base, and the projection of each offset prism on the package base is arranged annularly relative to the axis of the package base.

As one of the embodiments, the offset prism is installed on a lens frame, and each of the lens frames is stacked and fixed in sequence along the axis of the package base, and the formed stack structure is installed on the package base.

As one of the embodiments, the laser emission direction of the laser generating unit is toward the axis of the package base;

the pre-processing unit comprises:

a reflector, which is fixed on the package base, and is used to reflect the laser emitted by the laser generating unit to be parallel to the axis of the package base;

a collimating lens, which is fixed on the reflector, and is used to couple the divergent light reflected by the reflector into collimated light.

As one of the embodiments, the package base is a TO base, and the package cap is a TO cap.

As one of the embodiments, the laser generating unit is a laser chip, and the laser chip is mounted on the package base with a heat sink as carrier.

As one of the embodiments, each laser generating unit is respectively equipped with an electrical connector, and the electrical connector comprises a PIN group intersperse arranged on the package base and electrically connected with the corresponding laser generating unit.

As one of the embodiments, the package shell is also provided with a refrigeration module.

The present invention also relates to a multi-channel parallel transmission optical device, comprising the package structure for the multi-channel parallel optical transmission device mentioned above, the package shell is also connected with an adapter; the converging lens is used to couple the output beam to the optical fiber transmission part of the adapter.

The present invention has at least the following beneficial effects:

The present invention arranges each laser generating unit in a ring shape relative to the axis of the package base. Under the premise of completing the optical path design, it overcomes the problem that "parallel arrangement of laser chips in the traditional multi-channel parallel transmission optical device, which not only occupies horizontal space, but also causes serious waste of vertical space", and can significantly reduce the device package volume, correspondingly increase the channel density; the laser generating units are arranged annularly with respect to the axis of the package base, so that the package structure for the multi-channel parallel transmission optical device can be formed as a coaxial device, so it is suitable for coaxial packaging, which can significantly reduce the material cost and manufacturing cost of the device, and can obtain higher packaging reliability and packaging automaticity.

BRIEF DESCRIPTION OF THE DRAWINGS

In order to illustrate the embodiments of the present invention or the technical solutions in the prior art more clearly, the following will briefly introduce the drawings that need to be used in the description of the embodiments or the prior art. Obviously, the drawings in the following description are only some embodiments of the present invention, for those of ordinary skill in the art, other drawings can be obtained based on these drawings without creative work.

DETAILED DESCRIPTION OF THE EMBODIMENTS

The following is a clear and complete description of the technical solutions in the embodiments of the present invention. Obviously, the described embodiments are only part of the embodiments of the present invention, rather than all the embodiments. Based on the embodiments of the present invention, all other embodiments obtained by those of ordinary skill in the art without creative work shall fall within the protection scope of the present invention.

Example 1

Figure 1:
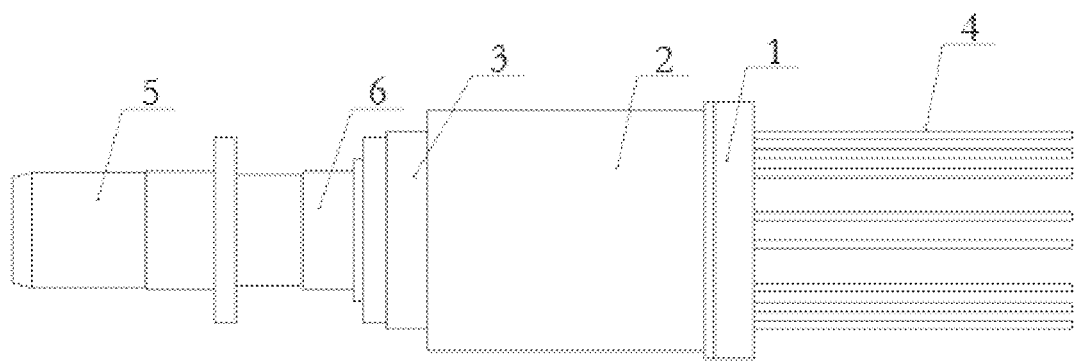
FIG. 1 shows the structural diagram of a multi-channel parallel transmission optical device provided by an embodiment of the present invention.
Figure 2:
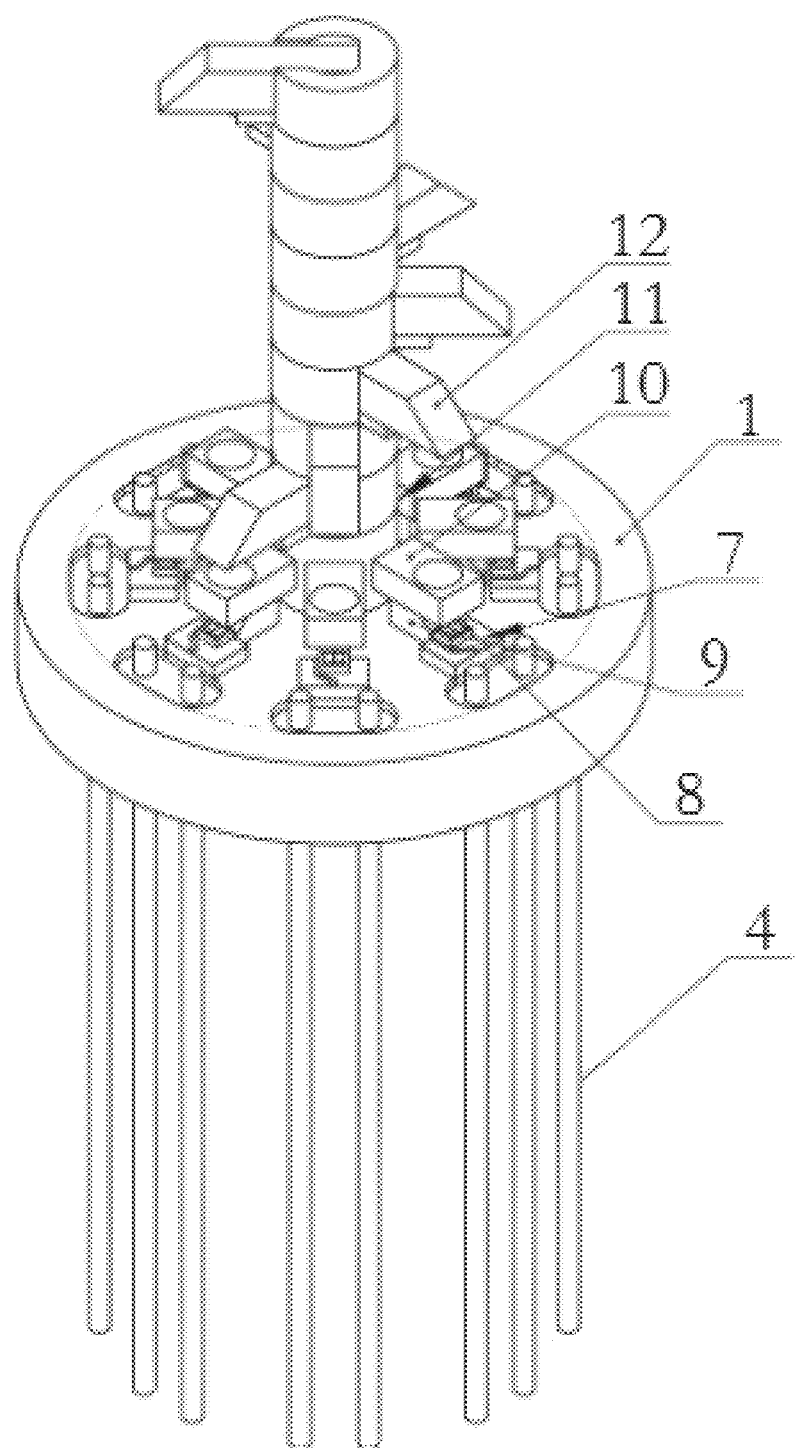
FIG. 2 shows the schematic diagram of a package structure for the multi-channel parallel transmission optical device provided by an embodiment of the present invention (the package cap and the converging lens are omitted)
Figure 3:
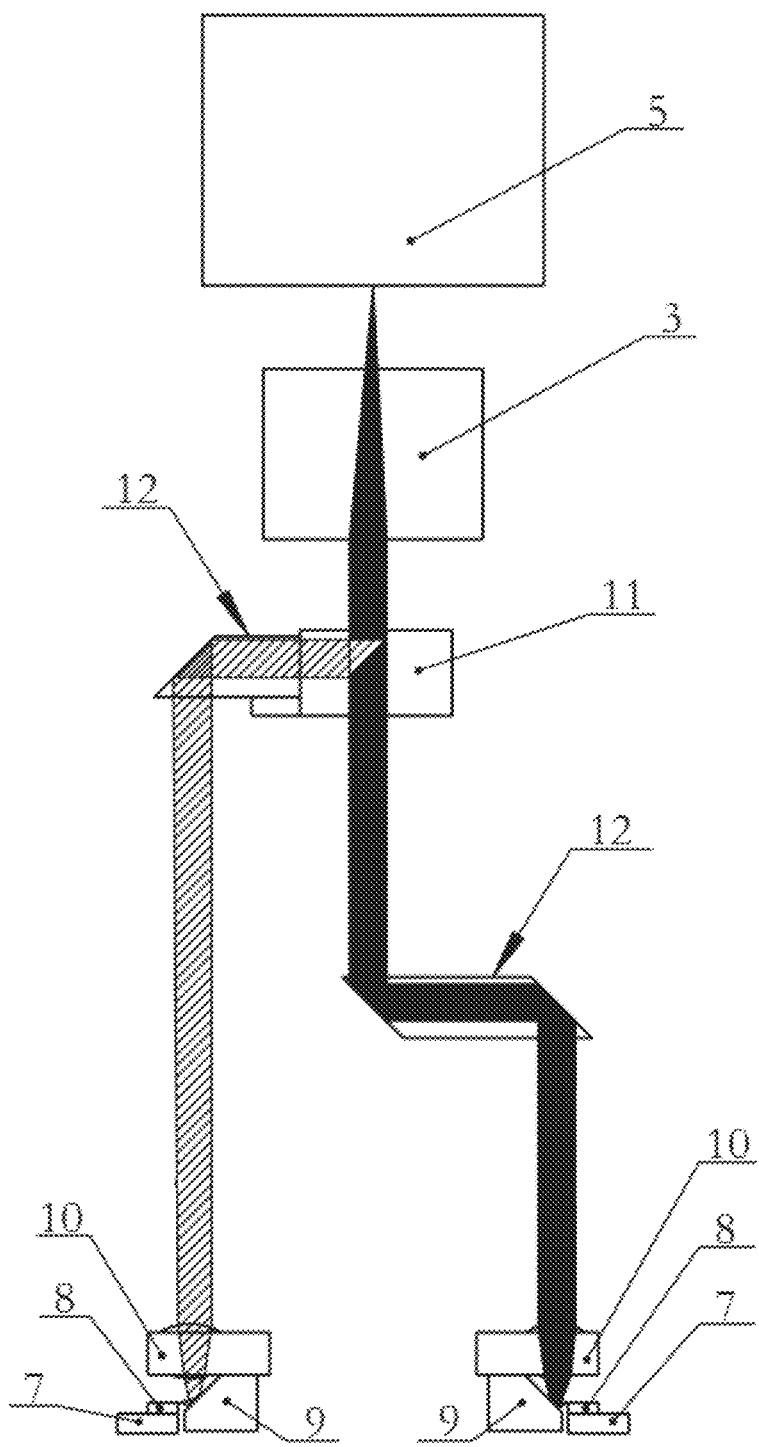
FIG. 3 shows the schematic diagram of the optical path of the multi-channel parallel transmission optical device provided by an embodiment of the present invention.

As shown in FIGS. 1-3, the embodiment of the present invention provides a package structure for the multi-channel parallel transmission optical device, comprising: a package base 1, a plurality of laser generating units 8 and a package cap 2; the laser generating units 8 are all mounted on the package base 1 and arranged annularly relative to the axis of the package base 1; each laser generating unit 8 is equipped with an optical mirror group to convert the laser emitted by the laser generating unit 8 into the laser beam parallel to the axis of the package base 1; the package cap 2 and the package base 1 are assembled to form a package shell, and the package shell encapsulates the optical mirror groups, wherein, a converging lens 3 is also configured inside or outside the package shell, or the package cap 2 uses the converging lens 2 as an optical window, and to converge each laser beam into output beam.

The laser generating unit 8 mentioned above usually adopts the laser chip 8; in this embodiment, distributed feedback laser (DFB) chip or electro-absorption modulated laser (EML) chip, or other vcsel chip is used.

In one of the embodiments, the laser chip 8 is mounted on the package base 1 with a heat sink 7 as carrier, that is, a heat sink 7 is arranged on the package base 1, and the laser chip 8 is arranged on the heat sink 7. Wherein, the heat sink 7 can be made of AlN, $Al_2O_3$ or other ceramic materials, or can be made of semiconductor materials such as silicon. Preferably, the laser chip 8 is welded to the heat sink 7 (e.g., by eutectic welding process) to prepare a chip on carrier (COC), which can be welded to the package base 1 with low temperature solder.

It can be understood that each laser generating unit 8 defines a laser channel, that is, the number of laser generating units 8 is determined according to the set number of channels in the multi-channel parallel transmission optical device.

In the optional embodiments, a printed circuit board is directly used to form the aforementioned package base 1, and the connection between the package cap 2 and the printed circuit board is a conventional structure, which will not be repeated here. The package shell formend by the assembly of these two is a non-airtight structure, in this solution, the above-mentioned laser chip 8 can be directly integrated on the printed circuit board.

In a more preferred solution, the package base 1 is a TO base 1, and the package cap 2 is a TO cap 2, that is, a TO packaging technology is adopted. Generally speaking, TO package devices are mostly used for single-shot or single-fiber bidirectional devices, for traditional multi-channel parallel devices, the TO packaging technology is not suitable because they are non-coaxial devices; however, in this embodiment, since the laser generating units 8 are arranged annularly with respect to the axis of the package base 1, the package structure for the multi-channel parallel transmission optical device can be configured as a coaxial device, which is suitable for coaxial packaging. The use of TO packaging technology to obtain multi-channel parallel transmission optical devices can significantly reduce device material costs and manufacturing costs, and can achieve higher packaging reliability and packaging automaticity.

In this embodiment, although the axis of the package base 1 is defined, this is based on the package base 1 having a regular shape (e.g., the main body adopts a cylindrical shape), but if the package base 1 has an irregular shape, it is obvious that the solution provided in this embodiment is also feasible and complete. The package cap 2 generally has a regular shape, the structure defined by the axis of the package base 1 can obviously also be defined with the axis of the package cap 2 as a reference line.

The output light beam generated by the coupling of the converging lens 3 is obviously preferably coaxial with the axis of the package base 1/the axis of the package cap 2/the axis of the package shell, especially when the TO packaging technology is adopted.

It can be understood that an optical window is provided on the package cap 2 to allow the laser light to pass through, except for the above-mentioned solution of "using the converging lens 3 as the optical window", other forms of optical windows are conventional technologies in the art and will not be described here. In this embodiment, the converging lens 3 is located outside the package shell, and it can be fixed on the package shell, for example, fixed on the package cap 2, and can be fixed by welding or other fixing methods; for the solution that the converging lens 3 is packaged in the package shell, the converging lens 3 can be fixed accordingly, which will not be described in detail here.

The laser generating units 8 are arranged annularly with respect to the axis of the package base 1, and preferably, the laser generating units 8 are evenly spaced, which can improve the balance of optical power. The laser emitting direction of the laser generating unit 8 can be parallel to the axis of the package bae 1, or parallel to the plane of the package base 1 (taking the axis of the package base 1 is parallel to the vertical as an example, the laser emitting direction of the laser generating unit 8 is parallel to horizontal); according to the different laser emission directions of the laser generating unit 8, the optical mirror group can be configured accordingly to ensure the integrity of the multi-channel optical path and meet the design requirements. Among them, the laser light generated by each laser generating unit 8 is preferably distributed annularly with respect to the axis of the package base 1.

As the preferred solution of this embodiment, the optical mirror group comprises: pre-processing unit for converting the laser emitted by the laser generating unit 8 into the collimated beam that parallel to the axis of the package base 1; and offset prism 12 for shifting the collimated beam to be close to or coincides with the axis of the package base 1, and the offset prism 12 is connected to the downstream of the pre-processing unit. The emitted light of each offset prism 12 is projected to the converging lens 3, and then converged and coupled by the converging lens 3 to form an output beam; among them, there may be a certain distance between the emitted light of each offset prism 12 and the axis of the package base 1, or the emitted light of each offset prism 12 is coincide with the axis of the package base 1 (but uncoaxial). When the converging lens 3 is coaxial with the package base 1, the emitted light of each offset prism 12/multiple incident light of the convergent lens 3 is obviously distributed annularly with respect to the axis of the package base 1.

When the pre-processing unit configured for each laser generating unit 8 is the same, and the offset amount of each offset prism 12 is also the same, since each laser generating unit 8 is arranged coplanar and needs to project the light path to the converging lens 3, the optical path length of each channel is consistent, so it is easy to ensure the optical power balance of the device. Further preferably, as shown in FIG. 2, each of the offset prisms 12 is arranged in sequence along the axis of the package base 1, and the projection of each offset prism 12 on the package base 1 is arranged annularly relative to the axis of the package base 1; based on this design, the arrangement of the offset prisms 12 is facilitated, the longitudinal space of the package structure/multi-channel device can be fully utilized, the compactness of the optical path arrangement is improved, and the volume of the optical device is correspondingly reduced. In one embodiment, as shown in FIG. 2 and FIG. 3, the offset prism 12 is installed on a lens frame 11, and each of the lens frames 11 is stacked and fixed in sequence along the axis of the package base 1, and the formed stack structure is installed on the package base 1; among them, the offset prism 12 and the lens frame 11 can be fixed by bonding, the above lens frame 11 can be a metal lens frame 11, and the adjacent metal lens frames 11 can be fixed by laser welding or other fixing methods, the metal frame 11 and the package base 1 can also be fixed by laser welding or other fixing methods, which is not described in detail here; the above lens frame 11 can also be an annular lens frame 11.

Taking the laser emitting direction of the laser generating unit 8 parallel to the plane of the package base 1 as an example, it is further preferred that the laser emitting direction of the laser generating unit 8 faces the axis of the package base 1, so as to facilitate the design of the optical path and further improve the compactness of the optical path arrangement. As shown in FIG. 2 and FIG. 3, the pre-processing unit comprises a reflector 9 and a collimating lens 10, the reflector 9 is fixed on the package base 1, and is used to reflect the laser emitted by the laser generating unit 8 to be parallel to the axis of the package base; the collimating lens 10 is fixed on the reflector, and is used to couple the divergent light reflected by the reflector into collimated light. Wherein, the reflector 9 can be fixed on the package base 1 by bonding or the like, or the back of the reflector 9 can be gold-plated and then welded to the package base 1 by eutectic welding. The collimating lens 10 can be fixed on the reflector 9 by means of glue bonding, etc. The collimating lens 10 can be a glass lens, a silicon lens or a lens of other materials. The combination of reflector 9 and collimating lens 10 is used to pre-process the laser, the reflector 9 can further reduce the offset of the offset prism 12 while completing its own function, thereby further improving the compactness of the optical path arrangement.

In other embodiment, the above pre-processing unit can also use a concave lens to complete the reflection and collimation functions.

The package structure for the multi-channel parallel transmission provided by the embodiment arranges each laser generating unit 8 in a ring shape relative to the axis of the package base 1. Under the premise of completing the optical path design, it overcomes the problem that "parallel arrangement of laser chips in the traditional multi-channel parallel transmission optical device, which not only occupies horizontal space, but also causes serious waste of vertical space", and can significantly reduce the device package volume, correspondingly increase the channel density. For example, using the packaging solution provided by this embodiment, the 8-channel parallel transmission optical device has a diameter of 6.5 mm and a length of less than 19 mm, which is equivalent to the current 4-channel parallel BOX package device, it can be seen that with the packaging solution provided in this embodiment, the channel density is twice that of the current mainstream solution. The laser generating units 8 are arranged annularly with respect to the axis of the package base 1, so that the package structure for the multi-channel parallel transmission optical device can be formed as a coaxial device, so it is suitable for coaxial packaging, which can significantly reduce the material cost and manufacturing cost of the device, and can obtain higher packaging reliability and packaging automaticity.

Further, each laser generating unit 8 is respectively equipped with an electrical connector to facilitate connection with external electrical devices; in one embodiment, as shown in FIG. 2, the electrical connector comprises a PIN group intersperse arranged on the package base 1 and electrically connected with the corresponding laser generating unit 8, wherein, preferably, PIN 4 can be electrically connected to the laser generating unit 8 by means of gold wire bonding. For the TO packaging solution, where the pin 4 is inserted is preferably sealed. In one of the embodiments, a glass insulator is used to fix the PIN 4 at the opening on the package base 1, the glass insulator is sintered and fixed with the package base 1 after melting the glass, which not only realizes the fixation of the PIN 4, but also ensures the airtightness of the opening of the package base 1.

Figure 4:
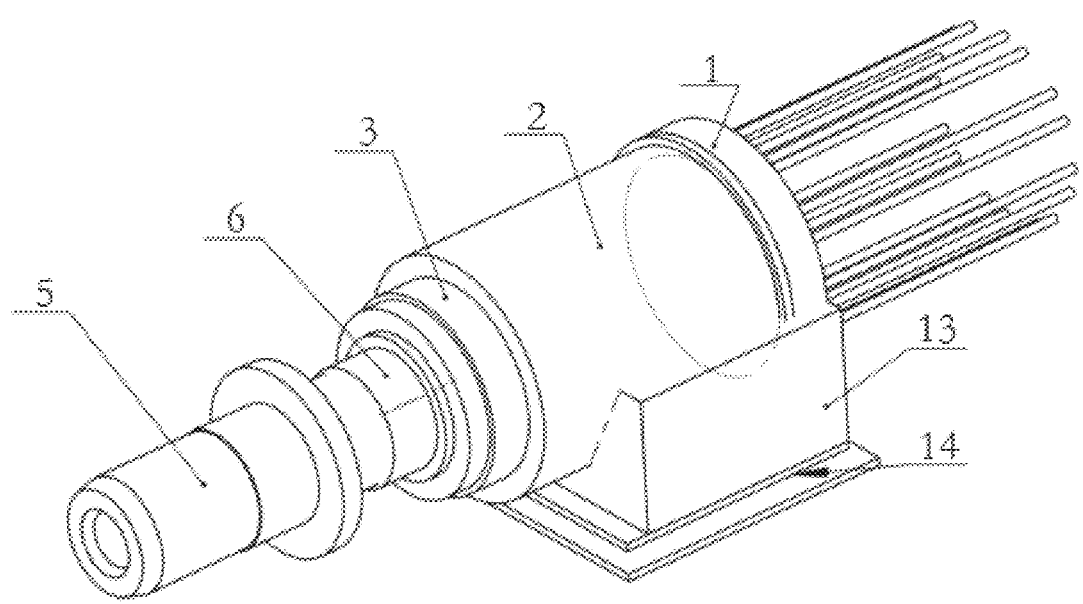
FIG. 4 shows the schematic diagram of the structure of a multi-channel parallel transmission optical device with a refrigeration module.

Further preferably, as shown in FIG. 4, the package shell is also provided with a refrigeration module for cooling the package structure and better deriving the heat generated by the chip. Alternatively, the refrigeration module comprises a heat dissipation block 13 adhered to the package shell, for example, the heat dissipation block 13 is adhered to the package cap 2; the refrigeration module may further comprises a thermoelectric cooler (TEC) 14 for controlling the overall temperature of the package structure. In addition, when the package base 1 is the TO base 1, it can be made of high thermal conductivity metal, such as tungsten copper, cold rolled steel, etc.

Example 2

As shown in FIGS. 1-4, the embodiment of the present invention provides a multi-channel parallel transmission optical device, comprising the package structure for the multi-channel parallel optical transmission device mentioned above, the package shell is also connected with an adapter 5; the converging lens 3 is used to couple the output beam to the optical fiber transmission part of the adapter 5.

The adaptor 5 is a conventional device in this field, which is used to connect an external optical fiber, and its optical fiber transmission part can adopt an optical fiber rod, etc. The specific structure is not described here.

Further, as shown in FIG. 1 to FIG. 4, the multi-channel parallel transmission optical device is also comprises a regulating ring 6 for regulates the distance between the adapter 5 and the converging lens 3 so that the optical power is coupled to the maximum. The adaptor 5 and the regulating ring 6 are conventional devices in this field, and the specific structure is not described here.

The assembly process of the multi-channel parallel transmission optical device is roughly as follows:

Fixing each laser generating unit 8 on the package base 1; for example, each laser chip 8 is welded to the heat sink 7 through the eutectic welding process, and then the heat sink 7 is welded to the package base 1;

bonding the reflector 9 on the package base 1 by glue;

after the coupling and debugging of each collimator lens 10 is completed, glue is used to solidify and bond each collimating lens 10 to the corresponding reflector 9:

bonding the offset prism 12 and the lens frame together, after the facula coupling between the collimating lens 10 and the offset prism 12 is completed, the fixing of the lens frame 11 is completed, for example, the laser welding process is used to complete the fixation between the frame 11 and the package base 1 or between adjacent frames 11;

completing the assembly between the package cap 2 and the package base 1, for example, use a resistance welding process to weld the flat window TO cap 2 to the TO base 1;

after the coupling and debugging between the package shell and the converging lens 3, the regulating ring 6, the adapter 5 are completed, the package shell and the converging lens 3, the regulating ring 6, the adapter 5 are assembled together, for example, fixed by laser welding, that is, the assembly of the multi-channel parallel transmission optical device is completed.

The above descriptions are only preferred embodiments of the present invention and not intended to limit the present invention. Any modification, equivalent replacement, improvement, etc. made within the spirit and principle of the present invention shall be included in the protection scope of the present invention.

What is claimed is:

1. A package structure for a multi-channel parallel transmission optical device, comprising: a package base, a plurality of laser generating units, and a package cap; wherein
the laser generating units are all mounted on the package base and arranged annularly relative to an axis of the package base;
each laser generating unit of the laser generating units is equipped with an optical mirror group to convert a laser emitted by the laser generating unit into a laser beam parallel to the axis of the package base;
the package cap and the package base are assembled to form a package shell, and the package shell encapsulates the optical mirror groups; wherein, a converging lens is also configured inside or outside the package shell, or the package cap uses the converging lens as an optical window, and to converge each laser beam into an output beam;
the optical mirror group comprises:
a pre-processing unit for converting the laser emitted by the laser generating units into a collimated beam parallel to the axis of the package base;
offset prisms for shifting the collimated beam to be close to or coincide with the axis of the package base, and the offset prisms are connected to a downstream of the pre-processing unit;
each of the offset prisms is arranged in sequence along the axis of the package base, and a projection of each of the offset prisms on the package base is arranged annularly relative to the axis of the package base.

2. The package structure for the multi-channel parallel transmission optical device according to claim 1, wherein the offset prisms are installed on a lens frame, and the lens frame is stacked and fixed in sequence along the axis of the package base to form a stack structure, and the stack structure is installed on the package base.

3. The package structure for the multi-channel parallel transmission optical device according to claim 1, wherein
a laser emission direction of the laser generating unit is toward the axis of the package base; and
the pre-processing unit comprises:
a reflector, wherein the reflector is fixed on the package base and is used to reflect the laser emitted by the laser generating unit to be parallel to the axis of the package base;
a collimating lens, wherein the collimating lens is fixed on the reflector and is used to couple a divergent light reflected by the reflector into collimated light.

4. The package structure for the multi-channel parallel transmission optical device according to claim 1, wherein the package base is a TO base, and the package cap is a TO cap.

5. The package structure for the multi-channel parallel transmission optical device according to claim 1, wherein the laser generating unit is a laser chip, and the laser chip is mounted on the package base with a heat sink as carrier.

6. The package structure for the multi-channel parallel transmission optical device according to claim 1, wherein each laser generating unit is respectively equipped with an electrical connector, and the electrical connector comprises a PIN group,
wherein the PIN group is interspersedly arranged on the package base and electrically connected with the corresponding laser generating unit.

7. The package structure for the multi-channel parallel transmission optical device according to claim 1, wherein the package shell is also provided with a refrigeration module.

8. A multi-channel parallel transmission optical device, comprising: the package structure for the multi-channel parallel optical transmission device according to claim 1, the package shell is also connected with an adapter; the converging lens is used to couple the output beam to an optical fiber transmission part of the adapter.

9. The multi-channel parallel transmission optical device according to claim 8, wherein the offset prisms are installed on a lens frame, and the lens frame is stacked and fixed in sequence along the axis of the package base to form a stack structure, and the stack structure is installed on the package base.

10. The multi-channel parallel transmission optical device according to claim 8, wherein
- a laser emission direction of the laser generating unit is toward the axis of the package base; and
- the pre-processing unit comprises:
    - a reflector, wherein the reflector is fixed on the package base and is used to reflect the laser emitted by the laser generating unit to be parallel to the axis of the package base;
    - a collimating lens, wherein the collimating lens is fixed on the reflector and is used to couple a divergent light reflected by the reflector into collimated light.

11. The multi-channel parallel transmission optical device according to claim 8, wherein the package base is a TO base, and the package cap is a TO cap.

12. The multi-channel parallel transmission optical device according to claim 8, wherein the laser generating unit is a laser chip, and the laser chip is mounted on the package base with a heat sink as carrier.

13. The multi-channel parallel transmission optical device according to claim 8, wherein each laser generating unit is respectively equipped with an electrical connector, and the electrical connector comprises a PIN group,
- wherein the PIN group is interspersedly arranged on the package base and electrically connected with the corresponding laser generating unit.

14. The multi-channel parallel transmission optical device according to claim 8, wherein the package shell is also provided with a refrigeration module.

\* \* \* \* \*